United States Patent [19]
Wortmann et al.

[11] Patent Number: 5,275,228
[45] Date of Patent: * Jan. 4, 1994

[54] PROCESS AND APPARATUS FOR PRODUCTION OF SINGLE-CRYSTAL TURBINE BLADES

[75] Inventors: Jürgen Wortmann, Weichs; Robert Wege, Munich, both of Fed. Rep. of Germany; Fritz Staub, Seuzach; Bruno Walser, Schottiken, both of Switzerland

[73] Assignee: Sulzer-MTU Casting Technology GmbH, Munich, Fed. Rep. of Germany

[*] Notice: The portion of the term of this patent subsequent to Mar. 16, 2010 has been disclaimed.

[21] Appl. No.: 806,876

[22] Filed: Dec. 12, 1991

[30] Foreign Application Priority Data

Dec. 13, 1990 [DE] Fed. Rep. of Germany ....... 4039808

[51] Int. Cl.$^5$ .............................................. B22D 27/04
[52] U.S. Cl. ............................... 164/122.2; 164/338.1
[58] Field of Search ................. 164/122.1, 122.2, 338.1

[56] References Cited
FOREIGN PATENT DOCUMENTS 2745247 4/1979 Fed. Rep. of Germany ... 164/122.1
2195277 4/1988 United Kingdom ............. 164/122.1

OTHER PUBLICATIONS

Sulzer Technical Review, Mar. 1988, "An Alternative Process for the Manufacture of Single Crystal Gas Turbine Blades" by Staub, Walser and Wortmann, pp. 11-16.
Aviation Week & Space Technology, Dec. 3, 1979, vol. 111, No. 23, "Computer-Controlled Production Gains" by Jerry Mayfield, pp. 41-44 and 53.

Primary Examiner—Kuang Y. Lin
Attorney, Agent, or Firm—Ladas & Parry

[57] ABSTRACT

A process and apparatus for the production of a single-crystal article, such as a turbine blade, by casting a molten metal into a casting mold with a single crystal seed crystal at the bottom of the casting mold. The casting mold is heated and vacuum-purified after which the seed crystal is introduced into an opening at the bottom of the mold in a matter of a few seconds whereafter the molten metal is immediately cast onto the seed crystal in the casting mold. The seed crystal is carried by a holder which is lifted to bring the seed crystal into the open bottom of the casting mold in sealed relation in the mold.

20 Claims, 2 Drawing Sheets

PROCESS AND APPARATUS FOR PRODUCTION OF SINGLE-CRYSTAL TURBINE BLADES

FIELD OF THE INVENTION

The invention relates to a process and apparatus for the production of a single crystal article, such as a turbine blade, by casting molten metal into a casting mold with a seed crystal arranged at the bottom of the casting mold.

BACKGROUND AND PRIOR ART

A process and apparatus are disclosed in U.S. Pat. No. 3,857,436, by which production of single-crystal structural parts is achieved by means of a single-crystal seed crystal placed at the bottom of a casting mold. This process and apparatus has the disadvantage that the seed crystal surface is subjected to an aggressive atmosphere due to the evaporation of volatile components from the casting mold during the entire purification and warm-up time of the casting mold, which increases the risk of polycrystal growth, slip formation and a high concentration of crystal defects at least in the initial phase of crystal growth. Additionally, the conventional seed crystals usually have a large number of defects, i.e. are defect-rich and thereby disadvantageously tend toward polycrystalline growth. These disadvantages lead to a low reproducibility of the single-crystal cultivation and thus to high waste.

SUMMARY OF THE INVENTION

An object of the invention is to provide a process and apparatus for increasing the reproducibility of the single-crystal cultivation in the production of single crystal articles, such as turbine blades so that less waste occurs, and valuable single-crystal blades can be produced for drive apparatus.

This object is satisfied by a process comprising the following steps:

a) preparing a defect-poor single-crystal seed crystal from a single-crystal blade material which has a defect-rich surface, but a defect-poor core;

b) heating the casting mold and melting a fusion material for the molten metal separately from the seed crystal, c) subsequently bringing together the seed crystal, heated casting mold, and molten metal when the casting mold and molten metal are at the casting temperature.

This process has the advantage that an undisrupted epitaxial growth of the melt at the seed crystal is assured due to the preparation of a defectpoor single-crystal seed crystal and the subsequent bringing together, at casting temperature, of the seed crystal, the heated casting mold and the molten metal, since the seed crystal is subjected to the heated casting mold only for a few seconds before being covered with the molten metal; thus a contamination of the seed crystal surface due to impurities, oxidation and corrosion can be avoided.

A preferred embodiment of the process provides for holding the single-crystal seed crystal in a shaped heat conductive block, so that the heat of crystallization can be abstracted through the heat conductive block. In the casting phase of the molten metal, due to the shape of the heat conductive block, it is advantageously achieved that the seed crystal is not disturbed. The seed crystal and the heat conductive block are preferably prepared such that they can be attached rapidly and under ultrapure spatial conditions in a coolable holder in a device for single-crystal cultivation.

Normally, stresses and crystal defects are produced in the seed crystal in the region close to the surface during grinding and polishing of the seed crystal material in the course of a finishing treatment. A further feature of the invention contemplates that directly prior to incorporation of the seed crystal in the heat conductive block, the seed crystal is freed of superficial, processing-conditioned stress-rich and defect-rich areas and layers. This may be achieved by means of plasma etching, sputter etching, electrochemical erosion, or chemical etching of the defective regions, so that the concentration of defects in the seed crystal is reduced to a maximum of three visually recognizable defects per $cm^2$ and with a defect surface of up to 0.1 $mm^2$. Such a low concentration of defects in the remaining seed crystal has been found to have no disturbing effect on single-crystal growth.

A further feature of the invention resides in the construction of a casting mold with an opening at the bottom of a casting cavity for a turbine blade for the introduction of the seed crystal into the opening, the cross section of the casting cavity smoothly and continuously increasing from the opening at the bottom for the seed crystal to the contour of the blade. A continuous single-crystal growth is advantageously promoted in this way and stepwise or abrupt cross sectional transitions, which could induce polycrystalline growth, are avoided.

The casting mold is heated to a casting temperature prior to casting of the molten metal thereinto and this phase represents a considerable source of contamination for the seed crystal. In another preferred embodiment of the process, the casting mold is purified at high-temperature in a vacuum in spaced, isolation from the seed crystal during the heating phase when the mold is heated to the casting temperature This has the advantage that a hot, highly pure casting mold is available for bringing together the seed crystal, casting mold, and molten metal. The absolute purity of the single-crystal surface of the seed crystal is achieved with this high-temperature vacuum purification process of the casting mold, so that the reproducibility of the single-crystal cultivation of the turbine blades is substantially improved The apparatus for conducting the single-crystal cultivation for turbine blades has spatially separate stations, including a first station having a crucible, a heating device for melting the fusion material in the crucible and a device for casting the melt from the crucible, a second station equipped with a releasable support for the casting mold and a heating device for separate high-temperature vacuum purification and heating of the casting mold, and a third station having a heat conductive block and a coolable holder furnished wit high-temperature-resistant coupling components for sealing connection of the casting mold and the heat conductive block.

The separate arrangement of the stations has the advantage that the components therein can undergo treatment, separated in time and space so that a mutual contamination is avoided in the preparation phase. Further, they may be equipped differently, depending on purity requirements. The above represent a minimum amount of equipment which is advantageous in high-temperature vacuum purification of the casting mold by means of a vacuum and a heating device which is of central significance for increasing the reproducibility of the single-crystal cultivation of the turbine blades.

Also, since considerable evaporation of impurities may occur during the melting of the fusion material, for example, from heat shields, the crucible, or the surface layers of the fusion material, it is advantageous to spatially separate this region in the first station from the remaining stations during the melting phase, while the third station holds the endangered highly pure and defect-poor surface of the seed crystal in a high-temperature vacuum purified and preheated state.

By means of the heat conductive block, which surrounds the seed crystal with clearance, the heat of crystallization is transmitted to the cooled holder during crystal growth. The cooling of the holder is only activated if required for the temperature control.

In the incorporation of the seed crystal into the heat conductive block, the seed crystal will project from the heat conductive block, preferably over a height which corresponds at least to the transverse or cross sectional width of the seed crystal. This has the advantage that in casting a superheated melt, the defectpoor and stress-poor core material of the seed crystal can be melted up to the level projecting from the heat conductive block, before single-crystal epitaxial growth ensues. The reliability and reproducibility of the process is thus further increased.

Several arrangements are suitable for short-time, sealed coupling of the seed crystal in the open bottom of casting mold after the latter has been preheated.

A preferred arrangement includes an outer flange at the bottom region of the casting mold, which corresponds in shape to a flange on the heat conductive block, so that advantageously a stepless transition is obtained between the seed crystal and the foot of the blade to be formed upon a precise placement of the opening at the bottom of the casting mold on the seed crystal.

In a further preferred arrangement, the flanges of the casting mold and the heat conductive block form a bayonet lock with tight internal conical surfaces, so that advantageously after placement of the casting mold onto the seed material, the tight internal conical surfaces assure a sealing placement and form-locking between the casting mold and the heat conductive block at high temperature by a rapid rotational movement of a bayonet ring of the bayonet lock.

The corresponding flanges preferably have an annular groove and a conical projection which fits into the groove to provide an aligned placement of the casting mold on the holder and form-fitting of the seed crystal into the casting mold.

Further, rapid locking of the holder and the casting mold can be obtained with at least two clamps which can be attached from the outside to join and secure the heat conductive block and the casting mold after they have been engaged in a rapid and aligned manner in the hot state.

The apparatus according to the invention ma have different spatial arrangements based on different devices for bringing the components in the station together.

In a preferred embodiment of the apparatus, the hot casting mold is transported first to the third station. In a subsequent combined transport of the casting mold and holder from the third station to the first station, the casting mold, the holder and the melt casting crucible are briefly operatively associated together. In this preferred embodiment, the casting crucible containing the hot melt is not transported, whereby the temperature of the melt may be maintained very precisely up until casting.

In another embodiment of the device, means are provided for transporting the hot casting mold from the second station to the third station and for transporting the crucible containing the molten metal from the first station to the third station. This has the advantage that the holder with the seed crystal and the heat conductive block is not transported, so that the temperature of the seed crystal remains precisely adjustable during the entire process.

In another preferred embodiment of the invention, the stations are arranged vertically one above another in a container. The container is divided into spatially separate spaces that can be evacuated and/or purged with gas after isolation by means of sliders between the stations. The first station with the crucible and tilting device is at the top region of the container. In the bottom region of the container is a lifting device to raise the holder to place the seed crystal in the open bottom of the casting mold and thereafter to lift the now coupled holder and mold to the crucible.

After initial preparations in the three stations in three separate spaces closed off by the sliders, the sliders are opened and the lifting device brings the three components into association, for casting, by a lifting motion advantageously in a very brief time.

It is further provided that several single-crystal turbine blades can be produced simultaneously by the apparatus. In this case, the apparatus provides several individual heat conductive blocks containing respective seed crystals for the blades, the blocks being supported and cooled by a common holder. In addition, the second station contains several casting molds, which can be joined with the holder of the heat conductive blocks prior to casting of the melt, for example, by a common flange.

DETAILED DESCRIPTION OF A PREFERRED EMBODIMENT

Figure 1:
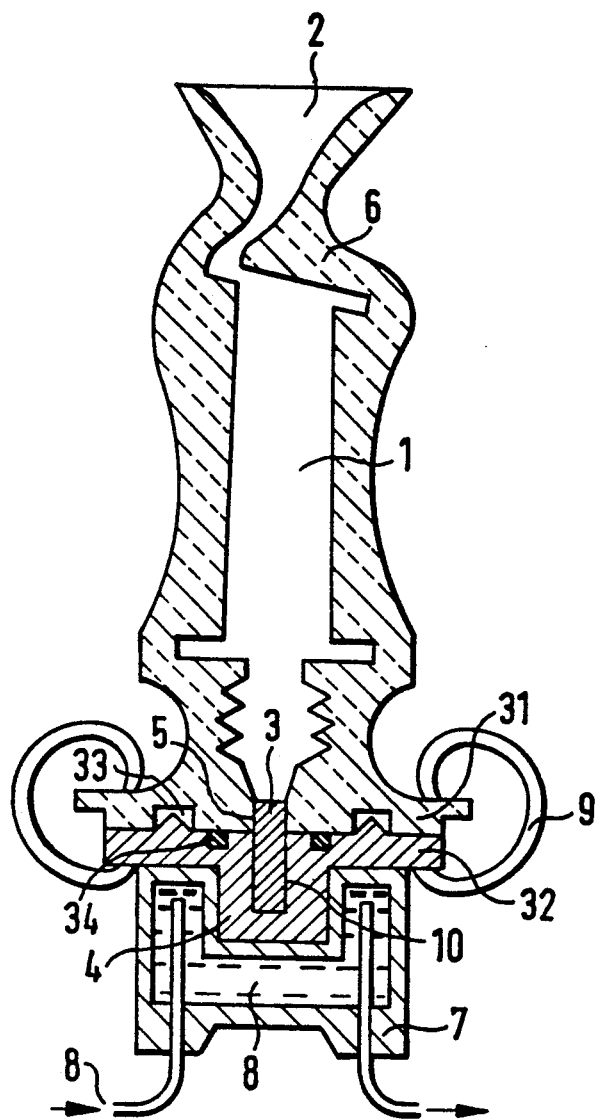
FIG. 1 is a vertical sectional view of a casting mold for a turbine blade with a seed crystal in a casting position.

FIG. 1 shows a casting mold 6 having a casting cavity 1 for forming an article, such as a turbine blade 1, with a single crystal composition. A seed crystal 3 is disposed at the bottom of casting cavity 1 in a casting position.

In a first working stage of the process of the invention, the seed crystal 3 is produced of single-crystal solid material in a known method first as a seed crystal blank that is rich in crystal defects. The seed crystal blank can be employed before a final removal of stress-rich and defect-rich layers near the surface of the blank, as a tool for the electroerosive etching of a recess 10 in a heat conductive block 4 in order to adapt the recess to the cross section of the seed crystal.

Subsequently, the seed crystal is prepared from the single-crystal seed crystal blank, which is rich in stress and defects on its surface, and which is usually also covered by oxide layers For this purpose, the surface of the seed crystal blank is removed to leave a single-crystal core material which is poor in defects and stresses and has a defect density of a maximum of three visually recognizable defects per cm$^2$ and a defect surface of not more than 0.1 mm$^2$. The seed crystal 3 is subsequently placed in recess 10 of heat conductive block 4. Then the heat conductive block is inserted into a holder 7, which has a cooling chamber 8.

The casting mold 6 is made of a heat-insulating material whose casting cavity is adapted to form the blade according to a conventional wax melting process. The mold 6 has an opening 5 at its bottom, which corresponds in size and shape to the cross section of seed crystal 3. Casting mold 6 has a casting hopper 2 formed at its top and the mold widens at its bottom region to form a flange 31, which confronts a flange 32 of heat conductive block 4. The flanges 31 and 32 are brought together in a pre-heated state just before casting and the flanges may be secured by clamps 9. An annular groove 33 is provided in flange 31 to receive a conical boss on the flange 32 to assure a precise, aligned placement of casting mold 6 onto heat conductive block 4. An annular groove 34 containing a seal is provided in flange 32 of the heat conductive block to seal casting mold 6 around seed crystal 3.

After a high-temperature vacuum purification and pre-heating of casting mold 6, separate from seed crystal 3, heat conductive block 4 with seed crystal 3 is engaged with casting mold 6, and the molten material which has been separately melted, is introduced into the hopper 2 of casting mold 6 onto seed crystal 3.

It is important for the success of the process that the highly pure surface of seed crystal 3 is melted until cooling chamber 8 in holder 7 abstracts sufficient heat via conductive block 4 so that a single-crystal epitaxial growth ensues at the molten seed crystal surface and a single-crystal blade is formed with increasing crystallization velocity.

Figure 2:
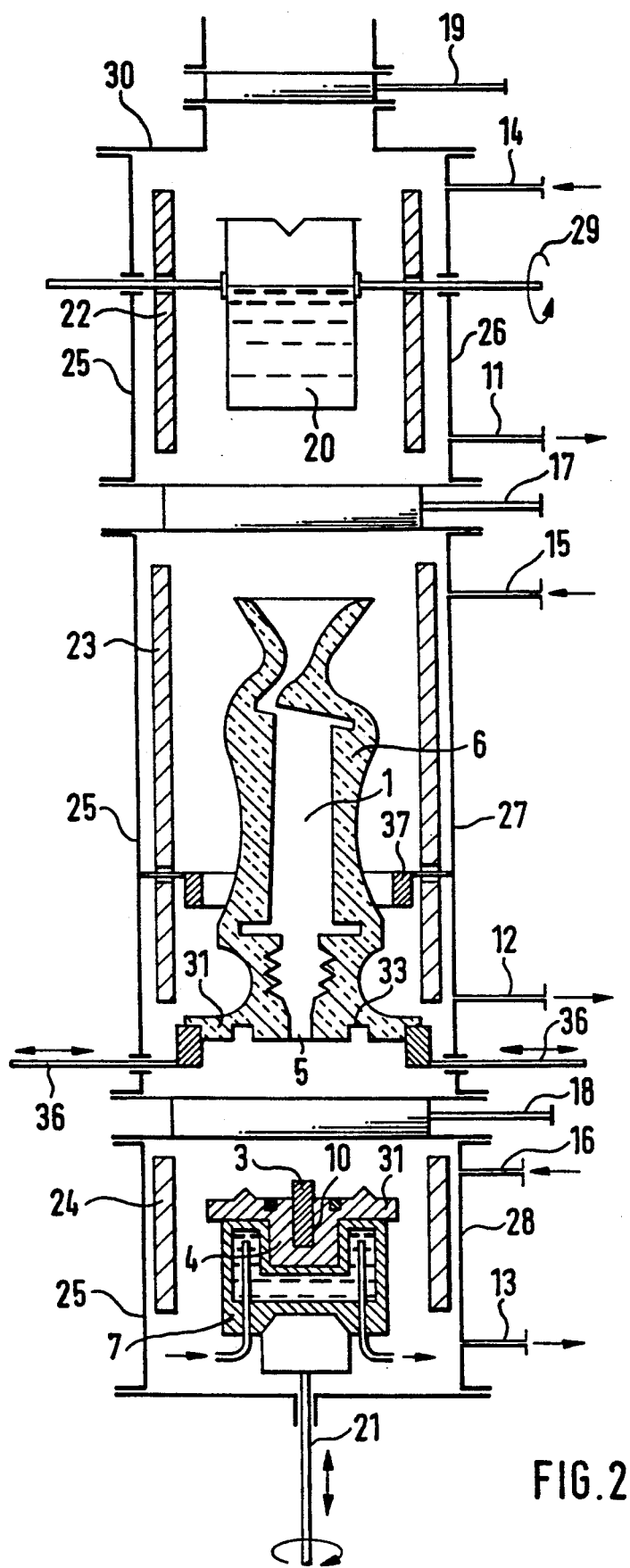
FIG. 2 is a vertical sectional view of apparatus for producing a single crystal turbine blade.

FIG. 2 shows the overall apparatus for the production of the single-crystal turbine blade and the apparatus has three locally separated stations 26, 27 and 28. The first station 26 is equipped with a crucible 20, a heating means 22 for melting the fusion material in crucible 20 and a tilting device 29 for casting the melt into the casting mold 6. The second station 27 is equipped with casting mold 6 resting on retractable support 36, the casting mold being open at opening 5 at its bottom for receiving the seed crystal 3 and a heating means 23 is provided for separate high-temperature vacuum purification and heating of casting mold 6. The third station 28 includes heat conductive block 4 with recess 10 for the seed crystal 3, and coolable holder 7, the holder 7 and mold 6 having the boss and groove arrangement previously described to form high-temperature-resistant coupling means for the sealed connection of casting mold 6 and heat conductive block 4.

The three stations 26, 27 and 28 are arranged above one another in a container 25 and the stations can be separated by two vacuum sliders 17 and 18. A third vacuum slider 19 in cover 30 of container 25 provides for introduction of the fusion material into crucible 20. Vacuum sliders 17 and 18 are closed during the melting of the fusion material in crucible 20, during high-temperature vacuum purification, and during heating of casting mold 6 and preheating of seed crystal 3. After completion of these preparation phases in the spatially separate stations 26, 27 and 28, sliders 17 and 18 are opened as soon as a pressure equilibration is produced by introducing inert gas by means of inlet lines 14, 15 and 16 or by adjusting the vacuum by means of vacuum lines 11, 12 and 13.

Subsequently, heat conductive block 4 is joined with casting mold 6 for a few seconds by means of lifting device 21 and block 4 coupled to the mold 6 are lifted together into the casting region of crucible 20. In the casting position, a stop ring 37 secured to container 25 engages flange 31 in its uppermost position to apply sufficient counter pressure to press flanges 31 and 32 together in a sealed manner at high temperature. After casting of the molten metal into mold 6 and the beginning of epitaxial growth, a complete single-crystal solidification of the molten metal can be produced in the position shown or at another station (not shown).

After complete solidification and removal of casting mold 6 from the apparatus, for example, through an openable door in container 25, casting mold 6 is separated by known means from the formed single-crystal blade. By providing suitable separation means in casting mold 6, it can be re-used after the cast blade is removed.

Although the invention has been described with reference to a specific embodiment thereof, it will become apparent to those skilled in the art that numerous modifications and variations can be made within the scope and spirit of the invention if defined by the attached claims.

What is claimed is:

1. A process for producing a single crystal article from cast molten metal comprising:
    forming a defect-poor single-crystal seed crystal from a single-crystal blade material which was rich in defects on its surface but which had a defect-poor core;
    heating a casting mold and melting a fusion material to form the molten metal for casting an article spatially separated from said seed crystal; and
    subsequently bringing together said seed crystal, said heated casting mold, and said molten metal at the casting temperature to form, after cooling said article of single crystal structure.

2. A process as claimed in claim 1 comprising supporting said seed crystal in a heat conductive block to promote single crystal epitaxial growth in said article.

3. A process as claimed in claim 2 wherein the supporting of the seed crystal in the heat conductive block is effected by inserting the seed crystal into the block immediately after the defect-rich region and surface layer of the crystal are removed to produce the defect-poor single crystal seed crystal.

4. A process as claimed in claim 1 comprising vacuum purifying the casting mold at high temperature in spatial separation from said seed crystal and the molten metal, and heating the casting mold to the casting temperature of the molten metal.

5. A process as claimed in claim 1 wherein the seed crystal, heated casting mold and molten metal are brought together by inserting the seed crystal into a bottom opening in the heated casting mold, and introducing the molten metal into the top of the casting mold.

6. A process as claimed in claim 5 wherein the seed crystal is sealingly inserted into the bottom of the casting mold after which the casting mold with the seed crystal are displaced to a station at which the molten metal is introduced into the casting mold.

7. A process as claimed in claim 1 comprising forming the casting mold with a casting cavity shaped to produce, as said article, a turbine blade.

8. Apparatus for producing a single crystal article from cast molten metal comprising:
  a casting mold having an open bottom,
  holder means for holding a seed crystal in spaced relation from said casting mold;
  means for providing relative movement between said casting mold and said holder means to introduce the seed crystal into the open bottom of the casting mold;
  sealing means on said casting mold and said holder means for sealing the casting mold and the holder means around said seed crystal when the latter is introduced into said open bottom of the casting mold; and
  means, including a crucible, for casting molten metal into said casting mold.

9. Apparatus as claimed in claim 8 comprising means establishing three spaced stations, said crucible being in a first station, said casting mold in a second station and said holder means and seed crystal in a third station.

10. Apparatus as claimed in claim 9 wherein said stations are disposed one adjacent to the other.

11. Apparatus as claimed in claim 11 wherein said stations are disposed one above the other.

12. Apparatus as claimed in claim 11 comprising first heating means in said first station for heating casting metal in the crucible to molten state, second heating means in the second station for heating the casting mold before the molten metal is cast into the casting mold, support means in- said second station for the removable support of said casting mold, said holder means being in the third station and including a heat-conductive block in which said seed crystal is supported in projecting relation therefrom and a holder supporting said heat-conductive block.

13. Apparatus as claimed in claim 12 wherein said seed crystal projects from said heat-conductive block by an amount which is at least equal to a transverse width dimension of said seed crystal.

14. Apparatus as claimed in claim 12 comprising a cooling chamber in said holder means.

15. Apparatus as claimed in claim 12 wherein said sealing means comprises a projecting boss on one of said casting mold and said heat-conductive block and a receiving groove on the other of said casting mold and said heat-conductive block, said boss being engaged in said groove when the, seed crystal is inserted into said casting mold, to align the casting mold and heat-conductive block.

16. Apparatus as claimed in claim 15 wherein said boss has a conical cross section.

17. Apparatus as claimed in claim 16 wherein said sealing means comprises an annular seal between the casting mold and the block surrounding said seed crystal.

18. Apparatus as claimed in claim 12 wherein said casting mold includes a lower flange and said heat-conductive block includes a further flange facing the flange on the casting mold, said flanges being pressed together when the casting mold and heat-conductive block are engaged.

19. Apparatus as claimed in claim 18 comprising clamp means for external attachment to the flanges of the casting mold and heat-conductive block when they are engaged together.

20. Apparatus as claimed in claim 12 comprising slider means between adjacent stations for separating said stations to enable each station to be separately evacuated and purged, and lifter means for lifting said holder means to bring said heat-conductive block into engagement with said casting mold and to lift the casting mold off said support means in the second station to bring the casting mold and the heat-conductive block engaged therewith into an operative position relative to said crucible for casting of the molten metal into the casting mold.

* * * * *